United States Patent
Lu et al.

(10) Patent No.: US 10,679,656 B1
(45) Date of Patent: Jun. 9, 2020

(54) MAGNETIC HEADS FOR USE IN DIFFERENT FLUID ATMOSPHERES, AND RELATED METHODS

(71) Applicant: Seagate Technology LLC, Cupertino, CA (US)

(72) Inventors: Jiaxi Lu, Bloomington, MN (US); Matthew Aaron Carper, Bloomington, MN (US); Abhik Rakshit, Bloomington, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 16/402,658

(22) Filed: May 3, 2019

(51) Int. Cl.
 *G11B 5/60* (2006.01)
 *G11B 5/48* (2006.01)
 *G11B 21/21* (2006.01)

(52) U.S. Cl.
 CPC ............ *G11B 5/6082* (2013.01); *G11B 5/484* (2013.01); *G11B 5/60* (2013.01); *G11B 5/6005* (2013.01); *G11B 5/6064* (2013.01); *G11B 21/21* (2013.01)

(58) Field of Classification Search
 None
 See application file for complete search history.

(56) References Cited

U.S. PATENT DOCUMENTS

| | | | |
|---|---|---|---|
| 5,343,343 A | 8/1994 | Chapin | |
| 5,396,386 A | 3/1995 | Bolasna et al. | |
| 5,404,256 A | 4/1995 | White | |
| 5,687,042 A | 11/1997 | Chhabra et al. | |
| 5,751,517 A | 5/1998 | Agarwal | |
| 5,796,551 A | 8/1998 | Samuelson | |
| 5,995,324 A | 11/1999 | Haddock et al. | |
| 6,188,547 B1 | 2/2001 | Gui et al. | |
| 6,594,113 B2 | 7/2003 | Rao et al. | |
| 6,700,727 B1 | 3/2004 | Crane et al. | |
| 7,262,937 B2* | 8/2007 | Pendray | G11B 5/6005 360/235.1 |
| 7,719,795 B2 | 5/2010 | Hu et al. | |
| 7,719,796 B2 | 5/2010 | Takahashi et al. | |
| 7,898,769 B2 | 3/2011 | Bolasna et al. | |
| 8,184,405 B1 | 5/2012 | Zheng et al. | |
| 8,254,063 B2 | 8/2012 | Zambri et al. | |
| 8,279,556 B2 | 10/2012 | Ruiz | |
| 8,427,784 B2* | 4/2013 | Sonoda | G11B 5/6082 360/235.7 |
| 8,867,172 B2* | 10/2014 | Zheng | G11B 5/607 360/235.7 |

(Continued)

OTHER PUBLICATIONS

Song et al., "Contact Between a Thermal Flying Height Control Slider", Microsystem Technologies, vol. 18, Issue 9-10, pp. 1549-1557, Jun. 22, 2012, (9 pages).

(Continued)

*Primary Examiner* — William J Klimowicz
(74) *Attorney, Agent, or Firm* — Kagan Binder, PLLC

(57) ABSTRACT

Described are magnetic recording heads that include an air-bearing surface and that are designed to be useful or potentially useful in two or more different types of fluid atmospheres; also described are related methods of testing the magnetic recording heads and installing the magnetic recording heads in a hard disk drive, as well as hard disk drives that contain a magnetic recording head as described.

14 Claims, 3 Drawing Sheets

(56) References Cited

U.S. PATENT DOCUMENTS

| | | | |
|---|---|---|---|
| 9,093,098 B2 | 7/2015 | Rajasekharan et al. | |
| 2004/0264053 A1* | 12/2004 | Pendray | G11B 5/54 360/236.3 |
| 2007/0121238 A1* | 5/2007 | Kondo | G11B 5/6005 360/235.7 |
| 2008/0174915 A1 | 7/2008 | Hipwell et al. | |

OTHER PUBLICATIONS

Gonzaga, et al., "Slider Design Optimization for Lube-Surfing Head-Disk Interface Scheme," IEEE Transactions on Magnetics, vol. 46, No. 6, pp. 1922-1924, Jun. 2010.

* cited by examiner

MAGNETIC HEADS FOR USE IN DIFFERENT FLUID ATMOSPHERES, AND RELATED METHODS

FIELD OF THE INVENTION

The present invention relates generally to the field of information storage devices in the form of hard disk drives, and more particularly to magnetic recording heads that include an air-bearing surface, as well as related methods.

BACKGROUND

Information storage devices are used to write, store, and selectively retrieve stored data in computers and other consumer electronics devices. A magnetic hard disk drive is an example of an information storage device that includes one or more magnetic heads that can read data, write data, or both, in conjunction with a magnetic recording medium (e.g., disk).

To perform functions of magnetically recording and reading data from a spinning magnetic disk, the magnetic head, suspended at the end of an actuator arm, must be correctly positioned over the magnetic disk surface during use, while the disk spins at a high rate of speed. The magnetic head must maintain a height ("fly height") and orientation (e.g., in terms of pitch and roll) at all tracks of a magnetic disk across the varied radii of the magnetic disk, even though the linear velocity of the disk will be slower at inner radii and substantially faster at outer radii.

To achieve desired fly height and orientation of the magnetic head, the head relies on an "air-bearing surface" that faces the spinning magnetic recording disk surface and maintains the magnetic head at a desired elevation above the surface. The air-bearing surface is designed to work with a fluid at the disk drive interior that moves past the air-bearing surface due to the spinning movement of the hard magnetic disk. Forces produced by the moving fluid on the air-bearing surface cause the air-bearing surface to be suspended at a stable height and stable orientation relative to the spinning magnetic disk. The fluid may be air or a lower density gas such as helium or a mixture of helium with air or another gas. Note that the term "air"-bearing is used herein even if the surrounding fluid is not air, e.g., is helium or another low density gas.

The air-bearing surface contains certain structures that cause the magnetic head to be held at a desired height and with stable orientation above the spinning disk surface. The structures are designed to place pressure and to direct airflow over the air-bearing surface in ways that are useful to provide desired fly height and stability. Examples of these surface structures include structures referred to as pads ("pressure pads" and a "center pad"), channels and rails (to direct flow), transition regions, and regions of a maximum etch depth, among others.

The composition of an atmosphere in which the magnetic head will function, e.g., helium or air, is an important factor that affects performance of an air-bearing surface, and must therefore be considered in the design of an air-bearing surface. Because of the very substantial difference between the density of air and the density of helium (which is about one seventh the density of air), magnetic heads and air-bearing surfaces have been designed for use in either an air atmosphere or a helium atmosphere, but are not typically designed to be used in more than one type of atmosphere.

SUMMARY

Magnetic recording heads are typically designed for use in either a hard disk drive that contains a helium atmosphere, or a hard disk drive that contains an air atmosphere. This is at least in part due to the substantial difference in the gas properties of helium and air. Generally, a magnetic head designed for use in a helium drive must meet performance requirements that are different from those required for use in an air drive.

When manufacturing magnetic heads or hard disk drives, the magnetic head is first tested outside of a disk drive, before final installation of the magnetic head in a drive. This "performance testing" determines whether a completed magnetic head is capable of functioning as required, if finally installed in a commercial drive. If the results of performance testing show that the magnetic head does not meet minimum performance requirements, the magnetic head cannot be used, and standard industry practice is to discard the magnetic head. Discarding magnetic heads that fail to meet minimum performance requirements carries a substantial cost, but at present the industry has no alternate use for these magnetic heads, and no way to avoid this waste and expense.

Reducing total production cost of magnetic heads and of hard disk drive devices is an ongoing goal for the hard disk drive industry. Helium and air are two different types of gases that are presently used in hard disk drives. At present, commercial magnetic heads useful in helium are not designed to be useful in air, and vice versa. The performance requirements and designs of commercial magnetic heads for use in these different gases include many features that are substantially different, causing magnetic heads to be not interchangeably useful between commercial air drives and commercial helium drives.

As now contemplated by the Applicant, a magnetic head may be designed to be useful in either a commercial helium hard disk drive or a commercial air hard disk drive. In specific, Applicant has identified structures of air-bearing surfaces of magnetic recording heads that can be designed to allow a magnetic head to be designed and potentially used in either an air or a helium environment. A single design for the magnetic head of two types of drives reduces total cost of the magnetic heads, and the drives, in various ways. A single head for different commercial disk drive products can result in improved efficiency in manufacturing, such as by reducing inventory costs and reducing manufacturing complexity.

The single design can also reduce cost by avoiding waste. For example, if a particular magnetic head fails the relatively more rigorous performance testing requirements for use in a helium drive, the head may still pass the less rigorous requirements for use in an air drive. Using the magnetic head in the air drive, if it proves unacceptable for use in a helium drive, can significantly reduce the amount of waste (discarded magnetic heads) in a manufacturing process.

Current commercial magnetic heads that are specifically designed for use in a helium drive are not designed for use or capable of being used, alternatively, in an air drive. The helium-dedicated magnetic heads do not have acceptable performance in an air atmosphere. In an environment of air, they have been found to exhibit a low fly height and a tilted fly profile across the radii of a spinning disk, extremely high pitch, very high fly height and roll sigma, very low roll stiffness, and very high environmental altitude loss.

The present description relates to magnetic heads that are designed to be useful or potentially useful in either a helium atmosphere or an air atmosphere. Magnetic heads produced with this type of design may be capable of a commercially-required level of performance in either atmosphere, e.g., may pass performance testing for use in a helium atmosphere and may also pass performance testing for use in an air atmosphere. Alternately, a magnetic head produced with this type of design may be designed for use in either type of atmosphere but if found by testing to be not useful in one type of atmosphere may, as a back-up use to avoid discarding the magnetic head, also be commercially useful in a second type of atmosphere. As a specific example, if a particular magnetic head fails relatively rigorous performance testing requirements for use in a first environment (e.g., that of a helium drive), the head may still pass relatively less rigorous requirements for use in a different type of environment (e.g., that of an air drive).

To design a magnetic head that is potentially useful in two different environments, of disparate densities, e.g., in both a higher density atmosphere (e.g., air) and a lower density atmosphere (e.g., helium), the Applicant has identified various important features of an air-bearing surface that can be selected and used in combination. In particular designs, the Applicant has identified certain features that can be selected to effectively provide a desired balance of properties that allows a magnetic head to be potentially used in both a helium drive and an air drive. These include a center pad region that includes a center pad and center pad channels, additional pressure pads, maximum depths of recessed features, and differences in depths of recessed features.

Certain specific examples of useful air-bearing surfaces include: a crown height in a range from 0.4 to 0.7 microinches; a center pad region that includes center pad channels at a recessed location that are relatively narrow and that are relatively closely-spaced, to provide a desirably high active pressure at the center pad; a shallow etch depth of a third etching step; and the use of multiple pressure pads in addition to a center pad, e.g., a total of 3 or 5 pads including a center pad and 2 or 4 additional pressure pads.

A desired combination of surface features of an air-bearing surface can reduced the level of performance differences of a magnetic head when tested for different environments of use, for example may be effective to alleviate the pitch increase and roll stiffness drop from use in helium to use in air, to achieve a commercially acceptable level of performance in both helium and air. A useful combination of surface features can also be effective to maintain a high level of active pressure at a center pad region of an air-bearing surface used in a helium atmosphere.

As used herein, the term "air-bearing surface" refers to a surface of a magnetic recording head (a.k.a. "magnetic head," "recording head," "slider," or the like) that is capable of useful performance in an air environment, but also refers to surfaces used or designed for use in non-air environments. While these environments can contain either air or a different gaseous fluid, e.g., a low density gas such as helium, the term "air-bearing" is used for convenience regardless of the particular gas of a device. Alternately, a slider that is designed for use or potential use in more than one type of gaseous environment may be referred to as an all-gas bearing slider, and a surface of the slider (facing the recording medium during use) can be referred to as "all-gas bearing" surface. An all-gas bearing surface may be capable (based on performance testing) of being used in more than one type of drive, e.g., in either an air drive or in a helium drive. An all-gas bearing slider may also be a slider that is designed for use in alternative environments: for use a first instance in a first environment (e.g., helium) having high performance requirements, but if the slider does not meet performance requirements for use in the first environment, the slider can be tested and potentially used in a different type of environment (e.g., air) having less rigorous performance requirements.

All-gas sliders have not previously been prepared or used, at least commercially. In the past, if a slider does not pass performance testing in a type of drive for which the slider is designed (e.g., a helium drive), the slider is discarded, resulting in significant lost cost. According to this invention, a slider can be specifically designed so that if it does not meet the performance requirements for use in a first type of drive (e.g., a helium drive), the slider may be potentially used in a different type of drive (e.g., an air drive). If the slider fails testing in the first type of drive, but is capable of passing testing requirements for use in the second type of drive, the slider is installed in the second drive and is not discarded.

In one aspect, the invention relates to a magnetic recording head. The head includes an air-bearing surface that includes an upper surface, multiple recessed surfaces of different depths relative to the upper surface, a leading edge, a trailing edge, and a longitudinal axis between the leading edge and the trailing edge. The head also includes a center pad region positioned toward the trailing edge, the center pad region including: a recessed center pad portion defined on opposed sides by opposed first and second center pad rails that extend in a length-wide direction, and defined on a trailing edge side by a back rail extending between the first and second center pad rails; a center pad extending from the back rail at least partly into the recessed center pad portion in a direction toward the leading edge; a first center pad channel between the center pad and the first center pad rail on a leading edge side of the back rail and a trailing edge side of the recessed center pad portion; and a second center pad channel between the center pad and the second center pad rail on a leading edge side of the back rail and a trailing edge side of the recessed center pad portion. The first center pad channel and the second center pad channel are located on opposed sides of the center pad and spaced not more than 22 microns apart, and the first center pad channel and the second center pad channel each independently has a width of from 5 to 20 microns. The head also includes an embedded transducer positioned toward the trailing edge proximate to the central longitudinal axis.

In another aspect, the invention relates to a method of manufacturing multiple hard disk drives, including multiple hard disk drives that contain a first atmosphere and multiple hard disk drives that contain a second atmosphere that is different from the first atmosphere. The method includes providing multiple recording heads that include: an air-bearing surface that includes an upper surface, multiple recessed surfaces of different depths relative to the upper surface, a leading edge, a trailing edge, and a longitudinal axis between the leading edge and the trailing edge; and a center pad region positioned toward the trailing edge. The center pad region includes: a recessed center pad portion defined on opposed sides by opposed first and second center pad rails that extend in a length-wide direction, and defined on a trailing edge side by a back rail extending between the first and second center pad rails; a center pad extending from the back rail at least partly into the recessed center pad portion in a direction toward the leading edge; a first center pad channel between the center pad and the first center pad rail on a leading edge side of the back rail and a trailing edge side of the recessed center pad portion, and a second center pad channel between the center pad and the second center pad rail on a leading edge side of the back rail and a trailing edge side of the recessed center pad portion. The multiple recording heads also include an embedded transducer positioned toward the trailing edge proximate to the central longitudinal axis. The method also includes: installing at least one of the multiple recording heads in a hard disk drive having the first atmosphere; and installing at least one of the multiple recording heads in a hard disk drive having the second atmosphere.

In yet another aspect, the invention relates to a method of using a magnetic head that includes an air-bearing surface and a transducer, the method including: testing the magnetic head to measure performance of the magnetic head for use in a first hard disk drive atmosphere that requires a first performance requirement; and if the magnetic head fails to meet the first performance requirement, testing the magnetic head to measure performance of the magnetic head for use in a second hard disk drive atmosphere that is different from the first hard disk drive atmosphere.

In another aspect, the invention relates to a method of using a plurality of magnetic heads, each head comprising an air-bearing surface and a transducer. The method includes: providing a plurality of magnetic heads; individually testing some of the magnetic heads to measure performance for use in a first hard disk drive atmosphere; if a tested magnetic head meets a performance requirement for use in the first hard disk drive atmosphere, installing the magnetic head in a hard disk drive containing the first hard disk drive atmosphere; individually testing some of the magnetic heads to measure performance for use in a second hard disk drive atmosphere that is different from the first hard disk drive atmosphere; and if a tested magnetic head meets a performance requirement for use in the second hard disk drive atmosphere, installing the magnetic head in a hard disk drive containing the second hard disk drive atmosphere.

DETAILED DESCRIPTION

Figure 1:
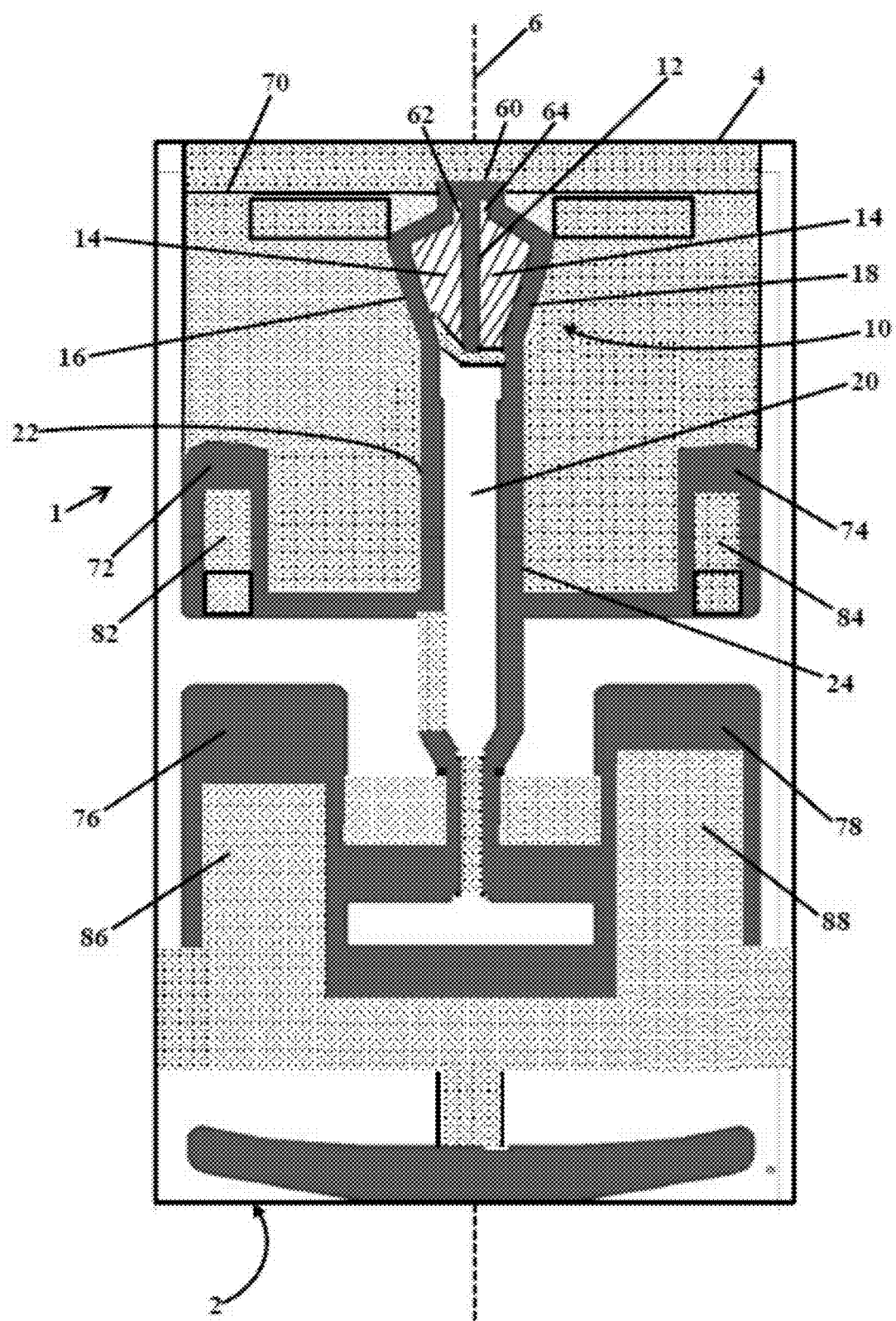
FIG. 1 shows a surface of a magnetic head as described.

The following description relates to magnetic heads (a.k.a. "sliders") that include an air-bearing surface having particular features that control the performance of the magnetic head during use in a gaseous environment. The description also relates to disk drives that include the magnetic heads, and methods of manufacturing disk drives to contain the magnetic heads, those methods including steps of testing the magnetic heads for use in one or more different gaseous environments of use, and selecting the magnetic head for installation in one or another environment based on the results of the performance testing.

A magnetic recording head is a microelectronic component of a hard disk drive that during use is positioned above a spinning magnetic disk, at which position the head can write or read data onto or from the disk. The recording head includes at least one transducer that can sense a magnetic field and convert the field into an electrical current (read the disk) or, vice versa, transform electrical current into a magnetic field (write the disk). A magnetic head or an assembly that includes the magnetic head may also be referred to as a "slider" or a "read-write head," or the like.

During operation of a hard disk drive the magnetic head will "fly" above a surface of the spinning magnetic disk with a clearance (i.e., "fly height") that may be as little as three nanometers. The fly height is affected by the design of the air-bearing surface on the disk-facing surface of the head (also sometimes referred to as the air-bearing surface). The role of the air-bearing surface is to maintain a relatively constant fly height and stable orientation of the magnetic head, as the head remains positioned above the moving surface of the spinning magnetic disk. If the head contacts the spinning surface of the disk, a catastrophic head crash can result. If the head and its transducer are positioned too far from the disk, reading and writing functionalities are inhibited.

A hard disk drive contains a gaseous interior atmosphere that contains a fluid that flows past the air-bearing surface during use, due to the movement of the disk past the air-bearing surface in the fluid environment. The spinning disk causes movement of the fluid, and the moving fluid impacts the air-bearing surface to produce specific forces on various surfaces of the air-bearing surface. Desirably, the moving fluid impacts the air-bearing surface to cause a desired fly height, desired pressures on certain surfaces of the air-bearing surface, and needed stability of the magnetic head during use, e.g., stability in roll and pitch orientations.

The gaseous interior may be air or may be a low density gas such as helium, which has a density that is substantially lower than that of air, e.g., a density of about one-seventh the density of air. The interior may also contain a mixture of helium with air or another gas, e.g., a concentrated helium environment such as at least 70, 80, or 90 percent helium by volume. Example interiors can contain air and may have a density of at least 1.2 kilograms per square meter. Other example atmospheres can contain concentrated helium, and may have a density below 0.3 kilograms per square meter.

The density of the fluid significantly affects the design of the air-bearing surface. Prior to the present invention, air-bearing surfaces have been specifically designed to allow for use in one specific type of gaseous atmosphere, e.g., either an air atmosphere or a helium atmosphere. Air-bearing surfaces have not previously been designed to allow for commercial use of a single design in either an air atmosphere or an atmosphere of a low density (e.g., helium) atmosphere.

The present invention relies on the Applicant's designs of air-bearing surfaces to be capable of performing at a commercial performance level in more than a just one type of gaseous atmosphere. The air-bearing surface may be designed to function in both a low density (e.g., helium) atmosphere and an air atmosphere. During manufacturing, this design allows for increased flexibility in use of the magnetic head in a manner that can reduce waste and reduce overall costs of the magnetic heads and disk drives that include them. For example, a magnetic head may be designed for use in a helium drive, or in an air drive if the magnetic head does not pass performance testing required for use in the helium drive. Such a magnetic head may be first tested for use in a helium drive and if the head meets performance requirements can be installed in the helium drive. If the head does not meet the performance requirements necessary for use in the helium drive, the head can be tested for use in an air drive. If the head meets the requirements necessary for use in the air drive, the head can be installed in the air drive—the cost of discarding the head for failing to meet the performance requirements of a helium drive is avoided.

During use, the head is suspended above a spinning magnetic recording disk with the air-bearing surface facing the disk and the transducer positioned above the disk as necessary to allow the transducer to magnetically read or write data relative to the disk. The head and air-bearing surface are generally rectangular with a length dimension that is greater than a width dimension. The surface includes a leading edge, a trailing edge, a central longitudinal axis extending centrally along a length from the leading edge to the trailing edge, and two longitudinal (lateral) sides also extending from the leading edge to the trailing edge.

As a convention herein, the longitudinal axis and sides are considered to be in a length or "x" direction. A width direction "y" extends between the sides in a direction parallel to the leading edge and the trailing edge. A height direction "z" is orthogonal to the length and width directions. A surface of the slider that is referred to as an "upper" surface, "top" surface, or "un-recessed" surface, is the exposed surface of the magnetic head that faces and is closest to the magnetic recording medium during use. Surfaces that are "recessed" are those surfaces that are spaced a distance in the z-direction away from the upper surface. The different surfaces, including the top surface and the recessed surfaces, can be referred to together as an "air-bearing surface."

A magnetic head as described can include a longitudinal out-of-plane curvature, commonly referred to as a "crown." This curvature can be measured as a difference between a maximum height (dimension in the z-direction) of the air-bearing surface (somewhere between the trailing edge and the leading edge) and a minimum height of the air-bearing surface (at a trailing edge, a leading edge, or both), with the head resting on a flat surface. A useful longitudinal curvature and magnitude of a crown for a particular head can be selected based on a variety of factors such as the gaseous environment in which the magnetic head will be used and desired performance factors (e.g., fly height) of the magnetic head, as well as processing factors, meaning the capabilities of process steps used in forming the air-bearing surface. For magnetic heads of the present description, non-limiting examples of crown high can be in a range from 0.4 to 0.7 microinches.

The air-bearing surface of a magnetic head includes various structures that during operation are affected by fluid moving over the air-bearing surface, to control the position and orientation of the magnetic head at a desired fly height and orientation. One such structure is a center pad region, which is located generally toward the trailing edge, at and adjacent to the longitudinal axis, e.g., on both sides of the longitudinal axis. The center pad region includes a center pad, which is located proximate to the central longitudinal axis. The center pad region also includes a recessed center pad portion, which is a recessed (relative to the upper surface and the center pad) area or areas located near the center pad including on two lateral sides of the center pad, at a recessed depth. The recessed center pad portion also includes two length-wise channels at a trailing edge region of the recessed center pad portion, one channel on each side of the center pad. Lateral sides of the recessed center pad portion are defined by a first center pad rail on one side and a second center pad rail on a second side. The center pad rails can be at the upper surface level, extend generally in the longitudinal direction, and may include portions that are parallel to the longitudinal axis as well as portions that are angled relative to the longitudinal axis. The recessed center pad portion can be structured and can have a depth relative to depths of other surfaces of the air-bearing surface so that the recessed center pad portion, particularly including the channels, provides desired fluid flow dynamics and a desirably high active pressure at the center pad region during operation of the slider.

Other surface structures that may be present as part of an air-bearing surface include additional rails or channels that guide or funnel a flow of fluid to a desired region of the air-bearing surface. Still other useful surface structures are additional pads (i.e., "pressure pads") located at the upper surface of the air-bearing surface, and that include an area that contacts fluid passing over the magnetic head in a way that the fluid places pressure on the head to maintain the position of the head a desired distance away from the surface of the magnetic recording medium during use. A magnetic head as described can include two or four pressure pads, preferably four, in addition to the center pad. The additional pressure pads can be located at or near the sides or side edges of the air-bearing surface.

The various recessed surface structures, at multiple different recessed levels or "depths" relative to the upper surface, are formed by using multiple etch steps, with each etch step selectively removing an amount of material in the depth (z) direction from the magnetic head surface. Example etch steps can be performed by various masking and etching techniques, many of which are known and commonly practiced for preparing air-bearing surfaces on magnetic heads. According to such methods for use in preparing an air-bearing surface as described, multiple successive masking (photolithography) and etching steps can be used to produce recessed surfaces at various depths relative to an upper surface of an air-bearing surface.

The z-direction position of the upper surface of the air-bearing surface, which is typically un-etched, can be taken as a reference depth having a "depth" of zero ($D_{ABS}=0$). A depth of a particular recessed surface relative to the air-bearing surface ($D_{ABS}$) can be selected and controlled by exposing the surface to one or a combination of masking and etch steps. Commonly, an etching process can include multiple (e.g., three) etching steps, referred to sometimes as a "mill 1" etch step, a "mill 2" etch step, and a "mill 3" etch step, performed as first, second, and third etch steps, with mask placement and mask removal between each step.

Each etch step can be used to remove a specified amount of material relative to a starting surface (a surface before a specific etch step) to result in a specified etch depth for that step, sometimes referred to as a "mill depth." A first etch step (a "mill 1" step) removes a first amount of material (a depth of $MD_1$) relative to the unetched surface before the mill 1 etch step. A next (second) etch step (a "mill 2" step) removes a different amount of material ($MD_2$), this time relative to a surface before the mill 2 etch step, following the mill 1 etch step. And a subsequent third etch step (a "mill 3" step) removes a third amount of material ($MD_3$) relative to a surface before the mill 3 etch step, after the mill 2 etch step. Typically, $MD_1$ is less than $MD_2$, which is less than $MD_3$. Note that each "mill depth" specified as $MD_1$, $MD_2$, and $MD_3$ is not a depth defined relative to the upper surface ($D_{ABS}$), but is a depth of an amount of material removed during an etch step from a surface relative to the position of a starting surface, which may already be recessed due to a previous etch step.

Certain presently preferred methods of preparing recessed surfaces of a slider can include three etch steps. A first etch step (mill 1) can remove an amount of material, measured as a depth of etching relative to a surface before the first etch step, in a range from 0.1 to 0.3 microns (i.e., $MD_1$=from 0.1 to 0.3 microns). A second etch step (mill 2) can remove an amount of material, measured as a depth of etching relative to a surface after the first etch step and before the second etch step, in a range from 0.3 to 1.0 microns (i.e., $MD_2$=from 0.3 to 1.0 microns). A third etch step (mill 3) can remove an amount of material, measured as a depth of etching relative to a surface before the third etch step, of up to 2.0, e.g. from 1.0 to 2.0 microns (i.e., $MD_3$ can be less than 2.0 microns, e.g., in a range from 1.0 to 2.0 microns).

Examples of three etch steps can produce recessed surfaces that are located at three or more different recessed depths relative to an un-etched upper surface level having a reference depth ($D_{ABS}$) of zero. A minimum depth (measured relative to $D_{ABS}$) of a recessed surface is a depth produced by a minimum-depth etch step, which may be a first etch step, and can be referred to as a minimum depth (D1); in a presently preferred example, a minimum depth (D1) can be equal to $MD_1$, which can be in a range from 0.1 to 0.3 microns.

A maximum depth ($D_{max}$) (measured relative to $D_{ABS}$) of all recessed surfaces of an air-bearing surface can be produced by exposing a surface to multiple etch steps, e.g., three etch steps, with the value of the maximum depth $D_{max}$ being the total of the mill depths of the multiple etch steps, e.g., a total of three mill depths: $MD_1$ plus $MD_2$ plus $MD_3$. Examples of maximum depths may be not greater than 2.5, 3.0, 3.3, or 3.5 microns, relative to $D_{ABS}$.

A pre-maximum depth ($D_{pre-max}$) is a depth produced from the first two etch steps: $MD_1$ plus $MD_2$. A difference between the maximum depth $D_{max}$ and the pre-maximum depth ($D_{pre-max}$) can be a depth of a third etch step, i.e., $MD_3$. Examples of presently-preferred values of a difference between a maximum depth and a pre-maximum depths can be equal to a presently-preferred depth $MD_3$ of a mill 3 etch step, which may be not greater than 2.0 microns, e.g., is in a range from 1.0 to 2.0 microns.

Example air-bearing surfaces are designed to be capable of functioning at a commercial level in both a low density (e.g., helium) atmosphere and an air atmosphere. During manufacturing, for various reasons, a magnetic head designed for use in either type of atmosphere might fail to meet certain minimum performance requirements, as determined by a manufacturer, for use of the head in one or both types of atmospheres. Manufacturers perform testing (e.g., "performance testing" or "quality testing") of magnetic heads before installing a magnetic head in a finished disk drive device to ensure that the head will meet the manufacturer's minimum performance requirements once installed.

According to methods of the present description, a commercial magnetic head, meaning one that is prepared by a manufacturer of hard disk drives for use in a commercial hard disk drive product, or by a supplier of commercial magnetic heads to such a manufacturer, is tested for performance before being installed in a disk drive. A magnetic head must be shown to be capable of a desired minimum level of performance in a certain type of disk drive, such as a disk drive that contains an air atmosphere (an "air drive") or a disk drive that contains a helium atmosphere (a "helium drive") or another type of low density atmosphere. To show such capability, a manufacturer or supplier (referred to herein collectively as a "manufacturer") will require the magnetic head to pass a series of performance tests. These performance tests may include performance with respect to fluid performance, such as fly height, pressure at a one or more locations of an air-bearing surface, and stability (with respect to roll and pitch). Additionally, the manufacturer will require the head to pass a series of dynamic electric testing, such as to assess reading and writing capabilities of a magnetic head with respect to reading and writing data from and onto a magnetic recording medium. These types of tests are sometimes referred to as slider level electric testing ("SDET") and include measures of "areal density capacity" (ADC) that can be written by the head, "bit error rate" of data written and read by the head, as well as other possible testing of reading and writing capabilities.

A manufacturer's performance test assesses whether a magnetic head is suitable for use in a particular atmosphere for which the head is intended to be used, i.e., an atmosphere of a disk drive into which the magnetic head will be installed if it passes required performance tests. The test may be performed in an atmosphere of the intended use (e.g., a helium atmosphere or an air atmosphere). Alternately, a test may be performed in one atmosphere (e.g., air), with test results being compared to calibrated test values that correlate to performance in a second atmosphere (e.g., helium).

Testing is often performed by methods and equipment designed to actually fly a magnetic head in a testing apparatus that mimics a use condition, and analyzing electrical performance of the head, before the head is permanently combined with another structure of a hard disk drive assembly such as a head gimbal assembly and a suspension arm. These testing methods include pre-wiring a head and separately mounting the wired head and a suspension into a test fixture. A magnetic disk is spun at a flying attitude relative to the head, and the performance of the head is recorded and analyzed. The environment used for testing may be a gaseous atmosphere that will be present at an interior of a commercial hard disk drive product with which the head is designed for use, such as air or a low density atmosphere of concentrated helium. The test conditions can be comparable to operating conditions of the commercial hard disk product, such as: a speed of rotation of a hard magnetic disk that will be used by the magnetic head for recording and reading data onto the spinning hard magnetic disk, and writing and reading data in amounts and densities of a commercial hard disk drive product with which the head is designed for use.

Minimum performance requirements for a magnetic recording head can be different for different types of product, and can and normally will be different for different manufacturers, i.e., minimum performance requirements are set by individual manufacturers and in this respect can be "subjective." Also, test procedures, conditions, and equipment can be and usually are different between manufacturers. Accordingly, methods as described for measuring adequacy of a magnetic recording head and whether a head meets a minimum level of performance are based on the minimum requirements of a particular manufacturer, as set by that manufacturer, and using testing procedures, conditions, and equipment normally used by that manufacturer for such testing. A manufacturer will normally subject magnetic recording heads to performance testing to determine whether a head meets the manufacturer's own (subjective) minimum performance requirements before installing the head in a disk drive for sale. If a head does meet the performance requirements of the manufacturer it is considered to "pass" the performance requirements. If a head does not meet the performance requirements of the manufacture, it is considered to not "pass" the performance requirements. Generally, in the past, magnetic recording heads that fail to meet minimum performance requirements upon testing are discarded, resulting in significant waste. With Applicant's invention, however, a magnetic head can be specifically designed so that if it does not meet relatively high minimum performance requirements of one type of drive (e.g., a helium drive), the head may be potentially used in a second type of drive, e.g., one having relatively lower minimum performance requirements (e.g., an air drive). If the head passes the testing requirements for use in the second type of drive, the head can be installed in that type of drive and is not discarded.

Methods of the present description include preparing multiple magnetic recording heads having a common (identical) design, on a single wafer. After testing, some of these heads are installed in hard disk drives having a first (e.g., low density) atmosphere, and some of the heads are installed in hard disk drives having a second (e.g., air) atmosphere. Many hundreds or thousands of magnetic heads having a common design can be prepared from a single wafer substrate, by semiconductor manufacturing techniques. The number of magnetic heads prepared from a single wafer may be hundreds, thousands, or more. According to the invention, magnetic recording heads having the same design, and prepared from a single wafer substrate, can be selectively installed as needed or based on performance either in a disk drive having a first atmosphere (e.g. helium) or in disk drive having a second atmosphere (e.g., air).

Figure 2:
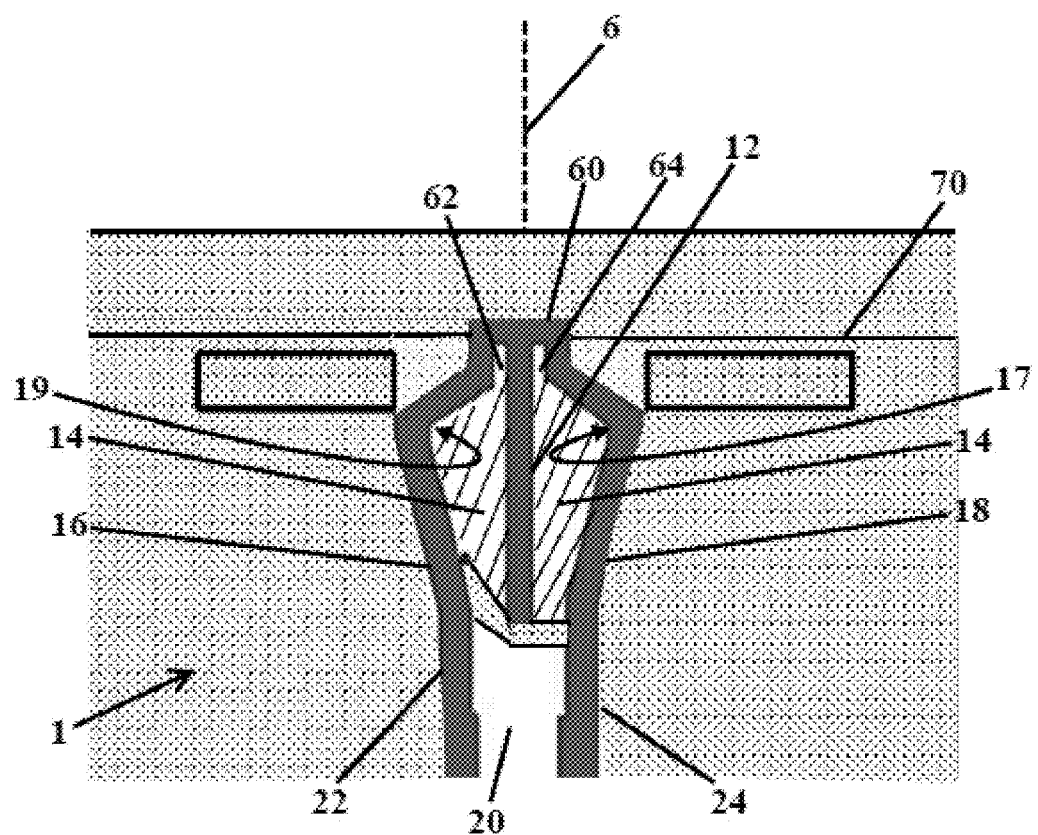
FIG. 2 shows a portion of a surface of a magnetic head as described.

An embodiment of an example air-bearing surface of a magnetic head as described is illustrated at FIGS. 1 and 2, which include shading to distinguish depths of various topographical features. Magnetic head 1 includes leading edge 2, trailing edge 4, central longitudinal axis 6, and two longitudinal sides connecting the leading edge and the trailing edge. Center pad region 10 includes center pad 12 located proximate to central longitudinal axis 6, and recessed center pad portion 14, which includes two areas (one on each side of center pad 12) defined by opposed first center pad rail 16 and second center pad rail 18, which extend generally in a direction of longitudinal axis 6. Center pad 12 connects to back rail 60 on a trailing edge end of center pad 12, and extends longitudinally in a direction toward leading edge 2 of head L Center pad 12 can preferably be of a uniform width along its length, can have a length that is greater than its width, and can have a length that extends toward leading edge 2 for a distance that passes into or at least a portion of, or an entire length of, recessed center pad portion 14. Center pad 12 can have a width that is less than 22 microns, e.g., less than 20 microns, and can have a length that is at least 2 or 3 times its width, e.g, a length in a range from 5 to 12 times its width, or from 7 to 11 times its width.

As shown, one or both of first center pad rail 16 and second center pad rail 18 may include portions that are angled relative to central longitudinal axis 16, which may provide advantageous fluid flow dynamics during operation of magnetic head 1. Likewise, one or both of first center pad rail 16 and second center pad rail 18 may include shoulder portions 17 and 19 that direct fluid flow in a direction that is not parallel to the central longitudinal axis, for example toward channels 62 and 64 (see infra). This directing of fluid flow to channels 62 and 64 may provide advantageous fluid flow dynamics during operation of head 1. Center pad region 10 is shown in more detail in FIG. 2, wherein like parts are identified by the same reference numerals.

Laterally-extending back rail 60 is located on a trailing edge side of recessed center pad portion 14, and connects a trailing edge end of center pad rail 16 to a trailing edge end of center pad rail 18. Center pad 12, center pad rails 16 and 18 together define channels 62 and 64, on a leading edge side of back rail 60, with one channel located on each side of center pad 12.

According to the present description and the example the center pad region 10 of FIGS. 1 and 2, channels 62 and 64 are sized as two relatively narrow channels, one on each side of center pad 12. The width of channels 62 and 64, and their distance of separation, are selected to provide a relatively high level of active pressure at the location of these channels during use, especially in a low density (e.g., helium) environment. A useful or preferred width of each of channel 62 and 64 (independently) can be in a range from 5 to 20 microns, e.g., from 7 to 15 microns. The separation between channels 62 and 64 (which also corresponds to the width of center pad 12 at the location between channels 62 and 64) can be relatively small, e.g., less than 22 microns, or less than 20 microns. These dimensions of the channels and the center pad cause a desirably high active pressure (e.g., at least 35, 40, 45, or 50 atmospheres) in the region of these structures, especially at a trailing edge region of one or more of channel 62 and 64, when operating in an air atmosphere and also when operating in a helium atmosphere.

Also shown at FIGS. 1A and 1B is breakline 70. This breakline represents a boundary between different materials used to form magnetic head 1. From the breakline in a direction toward leading edge 2, magnetic head 1 and the air-bearing surface are made of a first material, such as titanium carbide. In the opposite direction, from breakline 70 to trailing edge 4, magnetic head 1 and the air-bearing surface are made of a different material, such as aluminum oxide. As shown, the closed end of each channel 62 and 64 is on the leading edge side of and spaced from breakline 70. A useful or preferred distance of the closed ends of channels 62 and 64 from breakline 70 can be at least 2 microns, e.g., at least 3 or 4 microns.

A transducer (not specifically shown) is present at about center longitudinal axis 6, preferably between trailing edge 4 and breakline 70, e.g., embedded below back rail 60.

Shading of different regions designates different levels or "depths" of surfaces of the topographical features of illustrated air-bearing surface of slider 1. Upper or top (non-recessed) surfaces are shown in solid grey and are characterized as having a position at a top level of the air-bearing surface ($D_{ABS}$). For purposes of discussion of the embodiment shown in FIGS. 1 and 2, features that may preferably be at a level of the upper surface (i.e., $D_{ABS}$) include first center pad rail 16, second center pad rail 18, and center pad 12, among other surfaces shaded as grey.

Non-shaded surfaces, i.e., surfaces left solid white, are recessed surfaces that are recessed to a maximum depth ($D_{max}$) relative to the non-recessed (top) surfaces. These features can be formed by the cumulative removal of three mills steps having mill depths $MD_1$, $MD_2$, and $MD_3$. Examples of useful values for a maximum depth, $D_{max}$, can be depths of a maximum of 3.5, 3.3, 3.0, or 2.5 microns, relative to $D_{ABS}$.

Shading using lines for center pad region 110 shows that this region is recessed, for example to a depth of $MD_1$, e.g., in a range from 0.1 to 0.3 microns.

Shading in the form of the pattern of dots designates surface structures that are at one or more different depth levels that are between the level of the upper surface ($D_{ABS}$) and surfaces of depth $D_{max}$. These surfaces, designated with the pattern of dots, can be, e.g.: at a depth of D1 (e.g., from 0.1 to 0.3 microns), which may be a minimum depth produced during a first mill 1 etch step; or at a different depth D2 (e.g., up to 1.0 microns) produced by a single mill 2 etch step; or may be at a still different depth produced by a combination of multiple etch steps, meaning a combination of a mill 1 etch step and a mill 2 etch step.

Also illustrated at FIG. 1 are four pressure pads, 72, 74, 76, and 78, and four transition areas 82, 84, 86, and 88. Each transition area is located on the leading edge side of its respective pressure pad and is recessed, having a depth or multiple depths that are intermediate between the upper surface ($D_{ABS}$) and a maximum depth of recessed surfaces, $D_{max}$. Each pressure pad can be on the upper surface ($D_{max}$) and is of a size (area) and location to cause fluid flowing over the pressure pads to place pressure on the pressure pads in a way that affects the fly height of the magnetic head and causes a desired fly height and stability of the magnetic head during use.

Magnetic head 1 also includes centrally positioned down-track channel 20 defined by opposed first down-track rail 22 and second down-track rail 24 that are generally parallel to central longitudinal axis 6. Centrally positioned down-track channel 20 can be recessed relative to center pad 12, e.g., at a depth of $D_{max}$. Optionally (and as illustrated) a recessed surface of intermediate depth (e.g., a transition surface) may be located between a trailing edge end of down-track channel 20 and a leading end edge of recessed center pad portion 14, at one both sides thereof, at a leading end edge of center pad 12, or both.

First down-track rail 22 extends in the lengthwise direction and joins first center pad rail 16. Second down-track rail 24 extends in the lengthwise direction and joins second center pad rail 18. The first down-track rail 22 and the second down-track rail 24 can each independently be approximately between 50% and 70% of the length of magnetic head 1. Either or both of first down-track rail 22 and second down-track rail 24 may optionally be interrupted by a recessed surface that is at a depth that is lower than the respective rail, but not as low as a maximum depth. Optionally, one of first down-track rail 22 and second down-track rail 24 is at a depth that is lower than the other of the first down-track rail 22 and the second down-track rail 24 for some or all of the length of the rails. Additionally or optionally, one or both of first down-track rail 22 and second down-track rail 24 may be interrupted to provide one or more cross-track channels that are substantially perpendicular to central longitudinal axis 6.

According to preferred air-bearing surfaces, a magnetic head can be tested for use in, or installed for use in, either a helium drive or an air drive, and can preferably perform up to performance requirements that indicate suitability for use in a helium drive, an air drive, or both.

In particular examples, a magnetic head can be tested or used in a manner that achieves or is indicative of the ability to achieve a high active pressure at a region of a transducer of the magnetic head, which can be at or near a location of a center pad channel, especially a trailing edge region of a center pad channel. A magnetic recording head may be capable producing an active pressure near a transducer (e.g., at a center pad channel) of at least 35, 40, 45, 50, or 60 atmospheres in a helium atmosphere. The same magnetic recording head may also be capable producing an active pressure near a transducer (e.g., at a center pad channel) of at least 35, 40, 45, 50, or 60 atmospheres in an air atmosphere.

Additionally, the same magnetic recording head can preferably be capable of being used in a helium atmosphere at a fly height in a range of from 7 to 12 (e.g., 8 to 11) nanometers, as well as in an air atmosphere at a fly height in a range of from 7 to 12 (e.g., 8 to 11) nanometers. Preferred heads can are capable of being used at such a fly height when tested or used at an inner diameter, an outer diameter, and a middle diameter of a magnetic recording disk.

Figure 3A:
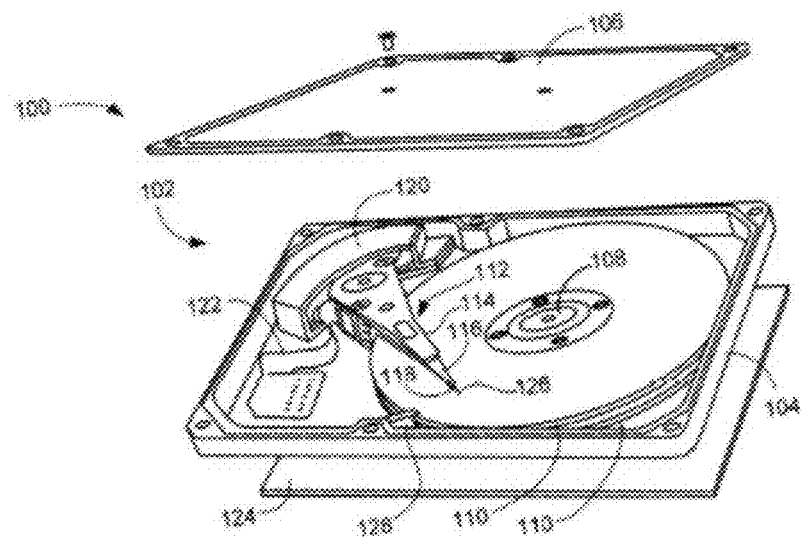
FIGS. 3A and 3B shows an exploded view of an exemplary hard disk drive that includes a magnetic head as described, and a sub-assembly thereof.
Figure 3B:
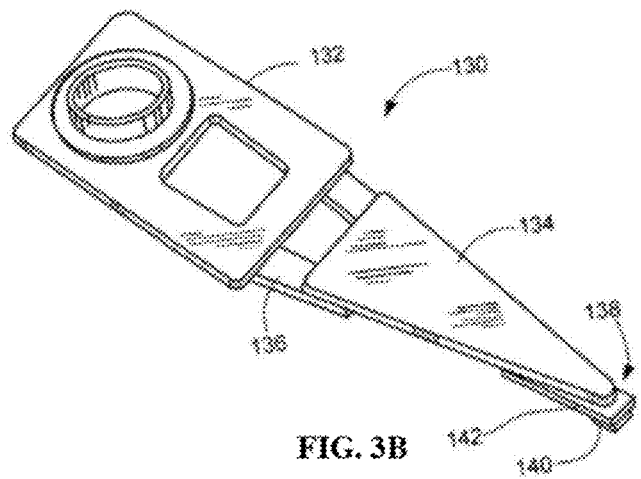

Examples of hard disk drives that contain a magnetic recording head as described are illustrated at FIGS. 3A and 3B. FIG. 3A is an exploded view of an exemplary data storage device 100. The device 100 includes a housing 102 formed from a base deck 104 and top cover 106. A gaseous atmosphere is retained within the housing, such as an air atmosphere or a low density, inert gas atmosphere (e.g., helium).

A spindle motor 108 is configured to rotate a number of storage media (e.g., magnetic discs) 110 at a selected high rotational velocity. An actuator assembly 112 includes rigid actuator arms 114, which support a corresponding array of flexible suspension assemblies (flexures) 116. At the end of each flexure 116 is a head gimbal assembly (HGA) 118. Each HGA includes a magnetic recording head that includes an air-bearing surface (as described herein) facing a surface of a magnetic disk, to allow the HGA to fly at a desired fly height above the associated surface. Read and write transducing elements are included in the magnetic recording head to read and write data relative to the media.

Actuator 112 is rotated by voice coil motor (VCM) 120. Electrically conductive signal paths are formed on a flexible printed circuit cable (flex circuit) 122, which couples the actuator 114 with a device printed circuit board (PCB) 124. The device PCB is mounted to an external surface of the base deck 104 and supports communication and control circuitry used by the device to interface with a host. In some embodiments, a ramp load tab 126 may project forward adjacent each HGA 118 to allow the HGAs to be unloaded from the media surfaces onto a ramp structure 128 when the device 100 is deactivated.

FIG. 3B is an isometric view of an exemplary suspension assembly 130. A base 132 supports a load beam 134 by way of a preload bend section 136. An HGA 138 is supported at a distal end of the load beam 134 and includes a magnetic recording head 140 and a gimbal plate 142.

The invention claimed is:

1. A magnetic recording head comprising:
    an air-bearing surface that includes an upper surface, multiple recessed surfaces of different depths relative to the upper surface, a leading edge, a trailing edge, a longitudinal axis between the leading edge and the trailing edge, and longitudinal curvature;
    a center pad region positioned toward the trailing edge, the center pad region comprising:
        a recessed center pad portion defined on opposed sides by opposed first and second center pad rails that extend in a length-wide direction, and defined on a trailing edge side by a back rail extending between the first and second center pad rails,
        a center pad extending from the back rail at least partly into the recessed center pad portion in a direction toward the leading edge,
        a first center, pad channel between the center pad and the first center pad rail on a leading edge side of the back rail and a trailing edge side of the recessed center pad portion, and
        a second center pad channel between the center pad and the second center pad rail on a leading edge side of the back rail and a trailing edge side of the recessed center pad portion,
        the first center pad channel and the second center pad channel located on opposed sides of the center pad and spaced not more than 22 microns apart, and the first center pad channel and the second center pad channel each independently having a width of from 5 to 20 microns; and
    an embedded transducer positioned toward the trailing edge proximate to the central longitudinal axis.

2. A magnetic recording head of claim 1, the first and second center pad channels each having a depth in a range from 0.1 to 0.3 micron relative to the upper surface.

3. A magnetic recording head of claim 1 wherein the first center pad channel and the second center pad channel each have a width in a range from 7 to 15 microns.

4. A magnetic recording head of claim 1 wherein the center pad channels are separated in the width direction by a distance of less than 20 microns.

5. A magnetic recording head of claim 1 wherein the upper surface includes a surface of the center pad, a surface of the back rail, surfaces of the first and second center pad rails, and surfaces of two or more pressure pads.

6. A magnetic recording head of claim 1 comprising the center pad and four additional pressure pads at the upper surface.

7. A magnetic recording head of claim 1 wherein the recessed surfaces have depths relative to the upper surface that include: a first depth (D1), a pre-maximum depth ($D_{pre-max}$) deeper than the first depth, and a maximum depth ($D_{max}$) deeper than the pre-maximum depth, with no recessed surface having a depth between the pre-maximum depth and the maximum depth, and a difference between the maximum depth and the pre-maximum depth is less than 2.0 microns.

8. A magnetic recording head of claim 7 wherein the maximum depth is less than 3.5 microns.

9. A magnetic recording head of claim 1 wherein the recessed surfaces are formed by, a series of three etching steps:

the first etching step ("mill 1") removed an amount of material in a depth direction of not more than 0.3 microns, the second etching step ("mill 2") removed an amount of material in a depth direction of not more than 1.0 micron, the third etching step ("mill 3") removed an amount of material in a depth direction of not more than 2.0 microns.

10. A magnetic recording head of claim 1 wherein the longitudinal curvature comprises a crown height in a range from 0.4 to 0.7 microinches.

11. A magnetic recording head of claim 1 wherein the magnetic recording head:

can achieve an active pressure at a center channel of at least 35 atmospheres in a helium atmosphere, and can achieve an active pressure at a center channel of at least 35 atmospheres in an air atmosphere.

12. A magnetic recording head of claim 1 wherein the magnetic recording head is capable of being used in a helium atmosphere at a fly height in a range of from 7 to 12 nanometers, and the magnetic recording head is capable of being used in an air atmosphere at a fly height in a range of from 7 to 12 nanometers.

13. A hard disk drive comprising a magnetic recording head of claim 1, the hard disk drive having an interior that contains concentrated helium.

14. A hard disk drive comprising a magnetic recording head of claim 1, the hard disk drive having an interior that contains an air atmosphere.

* * * * *